(12) United States Patent
Hokari et al.

(10) Patent No.: US 6,825,061 B2
(45) Date of Patent: Nov. 30, 2004

(54) METHOD OF MANUFACTURING ORGANIC EL DEVICE AND INK COMPOSITION FOR ORGANIC EL DEVICE

(75) Inventors: Hirofumi Hokari, Chino (JP); Shunichi Seki, Suwa (JP); Ryuji Ishii, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/357,310

(22) Filed: Feb. 3, 2003

(65) Prior Publication Data

US 2004/0099882 A1 May 27, 2004

(30) Foreign Application Priority Data

Feb. 4, 2002 (JP) ........................... 2002-027282

(51) Int. Cl.[7] .............................. H01L 51/40
(52) U.S. Cl. ..................... 438/99; 257/40; 257/59; 257/103
(58) Field of Search ................. 438/99; 257/40, 257/59, 103

(56) References Cited

U.S. PATENT DOCUMENTS 6,372,154 B1 * 4/2002 Li ........................ 252/301.16
6,656,611 B2 * 12/2003 Tai et al. ................... 428/690

FOREIGN PATENT DOCUMENTS

| JP | 05-182764 | 7/1993 |
| JP | 11-040352 | 2/1999 |
| JP | 11-040358 | 2/1999 |

OTHER PUBLICATIONS

Ahn, Taekyung et al, Effect of annealing of polythiophene derivative for polymer light–emitting diodes, Applied Physics Letters, vol. 80, No. 3, Jan. 21, 2002, pp. 392–394.

* cited by examiner

*Primary Examiner*—David Nelms
*Assistant Examiner*—Tu-Tu Ho
(74) *Attorney, Agent, or Firm*—Harness, Dickey & Pierce, P.L.C.

(57) ABSTRACT

In a method of manufacturing an organic EL device, when a light-emitting layer is formed, an ink composition for the organic EL device, including an organic light-emitting material and at least one type of a high boiling point solvent having a boiling point of 200° C. or more, is ejected onto a substrate having an electrode, or upon a hole injection/transport layer formed on the substrate having the electrode. Then, the ink composition is heat-treated while the residue of the high boiling point solvent remains. Hence, the method can provide an organic EL device that has a long lifetime and superior emissive properties, such as stability of emission luminance.

6 Claims, 6 Drawing Sheets

METHOD OF MANUFACTURING ORGANIC EL DEVICE AND INK COMPOSITION FOR ORGANIC EL DEVICE

BACKGROUND OF THE INVENTION

1. Technical Field

The present invention relates to a method of manufacturing an organic electroluminescent device ("organic EL device") and to an ink composition for an organic EL device.

2. Background Technology

The basic structure of an organic EL device includes a cathode and an anode sandwiching both sides of an organic thin film containing a fluorescent organic compound. When a voltage is applied between the cathode and anode, electrons from the cathode and holes from the anode are injected into the organic thin film. Driven by the applied electric field, the charge carriers move through the organic thin film, where they recombine. Excitons are generated by the energy given during recombination. When these excitons return to their ground state, energy is emitted in the form of a fluorescence or phosphorescence. This phenomenon is known as electroluminescent (EL) emission. Devices that use such EL emission are organic EL devices.

An organic molecule is used for the organic thin film. The use of an organic molecule makes it easy to control the color of emitted light. Materials can be used in myriad combinations to optimize the structure of the organic thin film for use in an organic EL device. For this reason, expectations are high in the display market for the realization of organic EL devices as low-voltage driven, high luminous efficiency, self-emitting elements.

The organic molecules that form the organic thin film can be broadly divided into two classes: the small molecule class or the polymer class. Organic thin films comprised of an organic small molecule are generally formed by vacuum deposition techniques, whereas polymeric organic thin films are generally formed by spin-coating or ink-jet printing a polymer that has been dissolved or dispersed in a solvent.

Incidentally, regardless of the type of organic molecule used, the performance of an organic EL device is significantly affected by the smoothness of the organic thin film that is formed and by the adhesion between organic thin films that are disposed in layers. These factors, which affect the uniformity of emissions and the state of contact with electrodes or other organic thin films, are strongly correlated to organic EL device degradation. For this reason, the technology for forming organic thin films is an important issue for improving the characteristics and lifetime of organic EL devices, and, hence, is the subject of considerable study.

Japanese Laid Open to the Public No. Hei 5-182764 describes a method of manufacturing an organic electroluminescent element wherein a light-emitting layer, formed by vacuum-depositing an organic compound, is heat-treated at a temperature of 50° C. or more but not more than the melting point of the organic compound, so as to form a microcrystalline condensed structure. Hence, the deterioration of organic EL device lifetime and the changes in organic EL device characteristics caused by heat generated during device driving are suppressed thereby.

Moreover, Japanese Laid Open to the Public No. Hei 11-40352 describes a method of manufacturing an organic EL device, where the organic layer, formed by vacuum deposition and including a low molecule dye, is heat-treated at a temperature range of −20 to +20° C. from the glass transition temperature of the material in the organic layer having the lowest glass transition temperature. Hence, the lifetime of the organic EL device can be extended thereby.

Furthermore, Japanese Laid Open to the Public No. Hei 11-40358 describes a method of manufacturing an organic EL device where an ink composition for the organic EL device, the ink composition including a precursor of a conjugated polymeric organic compound, is ejected by an ink-jet method. The ejected ink composition subsequently is polymerized by heat treatment so as to form the light-emitting layer.

SUMMARY OF THE INVENTION

However, it is difficult to control the film quality of organic thin films created using an ink-jet method, and the surface smoothness of thin films at interfaces and the mutual adhesion of organic thin films disposed atop one another in layers was particularly poor. Since both smoothness and adhesion affect the characteristics of light-emitting elements, these problems made it difficult to extend the lifetime of organic EL devices. In addition, heat generated during driving an element brings changes in the film structure. These structural changes have an adverse impact on organic EL devices, as they degrade the elements, reduce emission efficiency, change emission colors, and so forth.

The present invention, which takes the aforementioned situation into account, is intended to provide a method of manufacturing an organic EL device and an ink composition for an organic EL device having a long lifetime, as well as stable emission luminance and other superior emissive properties. The present invention proposes to achieve this by improving the smoothness of the organic thin film comprising the light-emitting layer and by improving the adhesion of organic thin films to one another where such films are disposed in layers.

Therefore, according to a preferred embodiment of a method of manufacturing an organic EL device of the present invention, a method of manufacturing an organic EL device having a light-emitting layer formed between a first electrode and a second electrode comprises forming a light-emitting layer on a first electrode by ejecting and heat-treating an ink composition for the organic EL device, including an organic light-emitting material and at least one type of a high boiling point solvent having a boiling point of 200° C. or higher.

After the ink composition for the organic EL device is thus ejected upon the first electrode, it is heat-treated, thereby smoothing the surface of the organic film, which is made up of droplets of the ink composition for the organic EL device, and enabling the manufacture of an organic EL device having excellent emissive properties and long lifetime.

Moreover, by pre-heat treating the organic thin film before a second electrode is formed, it is possible to approximate the film structure of an organic EL device in the driving state. Hence, distortion and other changes in film structure due to heat generated during driving an organic EL device can be minimized by this pre-heat treatment. Thus, these changes do not adversely affect element characteristics.

Furthermore, the aforementioned organic EL device is preferably manufactured by ejecting the ink composition for the organic EL device with an ink-jet apparatus.

Furthermore, the method of manufacturing the aforementioned organic EL device includes forming a plurality of pixels, including a plurality of dots, upon a substrate having a first electrode, each dot being separated by a barrier ("bank").

Furthermore, the aforementioned method of manufacturing the organic EL device comprises a method of controlling the quality of the organic thin film by performing heat treatment after the ink composition for the organic EL device is ejected and while a high boiling point solvent is still present. Heat treatment is preferably performed at a temperature at or below the boiling point of the high boiling point solvent. More preferable, heat treatment is performed at −15 to +40° C. from the glass transition temperature of the organic light-emitting material and, moreover, at not more than the boiling point of the high boiling point solvent.

By thus performing heat treatment with a high boiling point solvent remaining within the organic thin film formed from droplets of the ink composition for the organic EL device, the surface of the organic thin film can be smoothed, yielding an organic thin film having superior smoothness.

Moreover, the ink composition for an organic EL device in a preferred embodiment of the present invention contains an organic light-emitting material and a high boiling point solvent, the high boiling point solvent having a boiling point in the range from 200° C. to 400° C. at atmospheric pressure. In addition, the viscosity of the ink composition for the organic EL device is preferably 1 to 20 mPa.s. An ink composition for the organic EL device having a viscosity of 1 to 20 mPa.s can be smoothly ejected from a nozzle hole of an ink-jet apparatus.

DETAILED DESCRIPTION OF THE PREFERRED EMBODIMENTS

An ink composition for the organic EL device of the present invention is described.

According to a method of manufacturing an organic EL device of the present invention, a light-emitting layer is formed with an ink composition. The ink composition comprises an organic light-emitting material and a high boiling point solvent having a boiling point of 200° C. or higher.

The following are examples of materials that can be used as the organic light-emitting material shown in Compound 1 through Compound 5 below such as: any of the polyfluorene-type polymer derivatives, a (poly)-paraphenylene-vinylene derivative, a polyphenylene derivative, a polyvinyl carbazole, a polythiophene derivative, a perylene dye, a coumarin dye, or a rhodamine dye. Also available for use is any of the aforementioned polymers doped with an organic EL material, for example rubrene, perylene, 9, 10-diphenyl anthracene, tetraphenyl butadiene, Nile red, coumarin 6, or quinacridone. These organic light-emitting materials are preferably present in the ink composition at a concentration of from 0.5 to 1.5% by weight.

Compound 4

Compound 5

The high boiling point solvent, which has a boiling point of from 200° C. to 400° C. under atmospheric pressure, may be used alone or as a mixture.

The following can be cited as examples of high boiling point solvents: dodecylbenzene (boiling point of 331° C.), cyclohexylbenzene (boiling point of 240° C.), 1, 2, 3, 4-tetramethylbenzene (boiling point of 203° C.), 3-isopropylbiphenyl (boiling point of 290° C.), 3-methylbiphenyl (boiling point of 272° C.), 4-methylbiphenyl (boiling point of 267° C.), p-anisyl alcohol (boiling point of 259° C.), 1-methylnaphthalene (boiling point of 240 to 243° C.), 1, 2, 3, 4-tetrahydronaphthalene (boiling point of 207° C.), or their derivatives.

The inclusion of such a solvent with a high boiling point prevents the solvent from immediately evaporating completely when the ink composition for the organic EL device is ejected by an ink-jet apparatus or other apparatus. The solvent instead remains within the organic thin film, which is then heat-treated to obtain an organic thin film having excellent surface smoothness and excellent mutual adhesion between stacked thin-films.

The ink composition for the organic EL device, which contains the aforementioned organic light-emitting material and at least one type of high boiling point solvent, preferably has a viscosity of from 1 to 20 mPa.s.

If the viscosity is less than 1 mPa.s, forming a light-emitting layer having the prescribed thickness is difficult because the concentration of the organic light-emitting material is too thin. Conversely, a viscosity exceeding 20 mPa.s is undesirable since the ejection nozzles clog when the ink composition for the organic EL device is ejected by an ink-jet apparatus.

As explained above, the ink composition for the organic EL device of the present invention can improve the smoothness of organic thin films and improve their adhesion to one another where they are disposed in layers. The ink composition also makes it possible to obtain an organic EL device having long lifetime and superior emissive properties such as stability of emission luminance.

The manufacturing method of the organic EL device of the present invention is explained below with reference to figures.

The scale used in FIG. 1 through FIG. 6 is depicted differently than in actual practice in order to make layers and materials large enough to be seen and recognized in the drawings.

Figure 1:
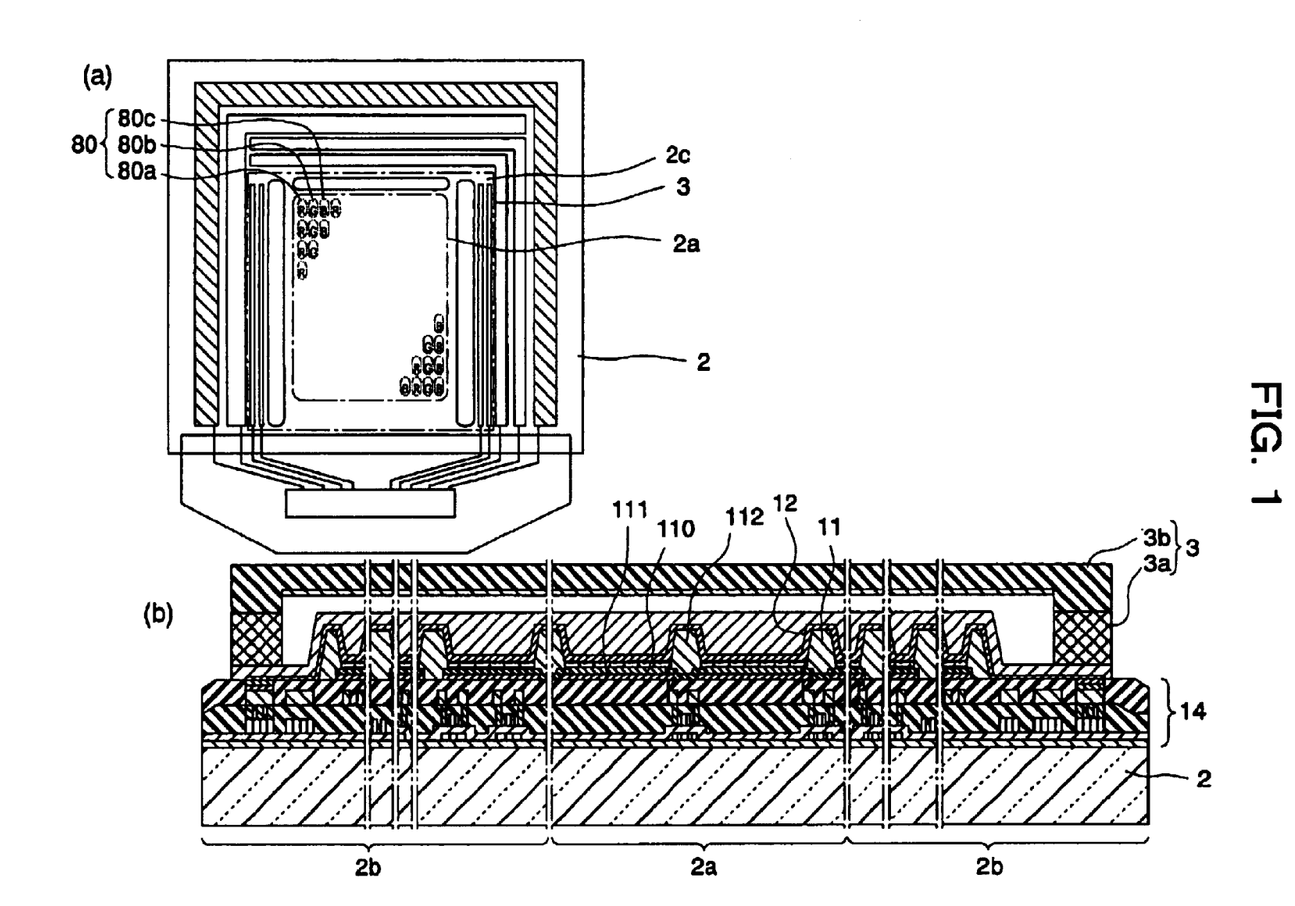
FIGS. 1(a) and 1(b) show a preferred embodiment of an organic EL device applying the manufacturing method of the present invention, where 1(a) is a plan schematic view and 1(b) is a schematic sectional view.

FIG. 1 contains a plan schematic view and a sectional view showing a preferred embodiment of an organic EL device manufactured in accordance with the method of the present invention. As shown in FIG. 1(a) and (b), the organic EL device comprises a substrate 2 and emissive elements arranged in a matrix, wherein a portion of the emissive elements 11 is formed upon the substrate 2.

The aforementioned substrate 2 is, for example, a transparent substrate of glass. The substrate 2 is divided into an effective viewing area 2a, located in the center of the substrate 2, and a non-viewing area 2b, formed along the edge of the substrate 2 and to the outside of the effective viewing area 2a.

The aforementioned effective viewing area 2a is a region formed by the emissive elements arranged in a matrix. In the non-viewing area 2b formed to the outside of the effective viewing area 2a, a dummy viewing area 2c is formed adjacent to the effective viewing area 2a.

In addition, as shown in FIG. 1(a), a sealing member 3 is provided on top of the emissive element 11. This sealing member 3 comprises a sealing resin 3a that may include, for example, a thermosetting resin or a UV curing resin applied in a coat atop the second electrode 12, and of a sealing substrate 3b disposed upon the sealing resin 3a. A sealing resin 3a that does not give off a gas, solvent or other material at the time of curing is preferable.

The sealing member 3, which is formed such that it nearly covers at least the second electrode 12, shields the second electrode 12 and light-emitting layer against the incursion of water or oxygen. Furthermore, the sealing member 3 also prevents the second electrode 12 or the light-emitting layer from oxidizing. Moreover, the sealing substrate 3b, which is bonded to a sealing resin 3a and protects the sealing resin 3a, is preferably a glass plate, a metal plate, or a resin plate.

In addition, a can seal type of sealing substrate is preferable. An attracting material may be placed within a concavity to absorb oxygen and prevent oxidation within the sealed interior.

Figure 2:
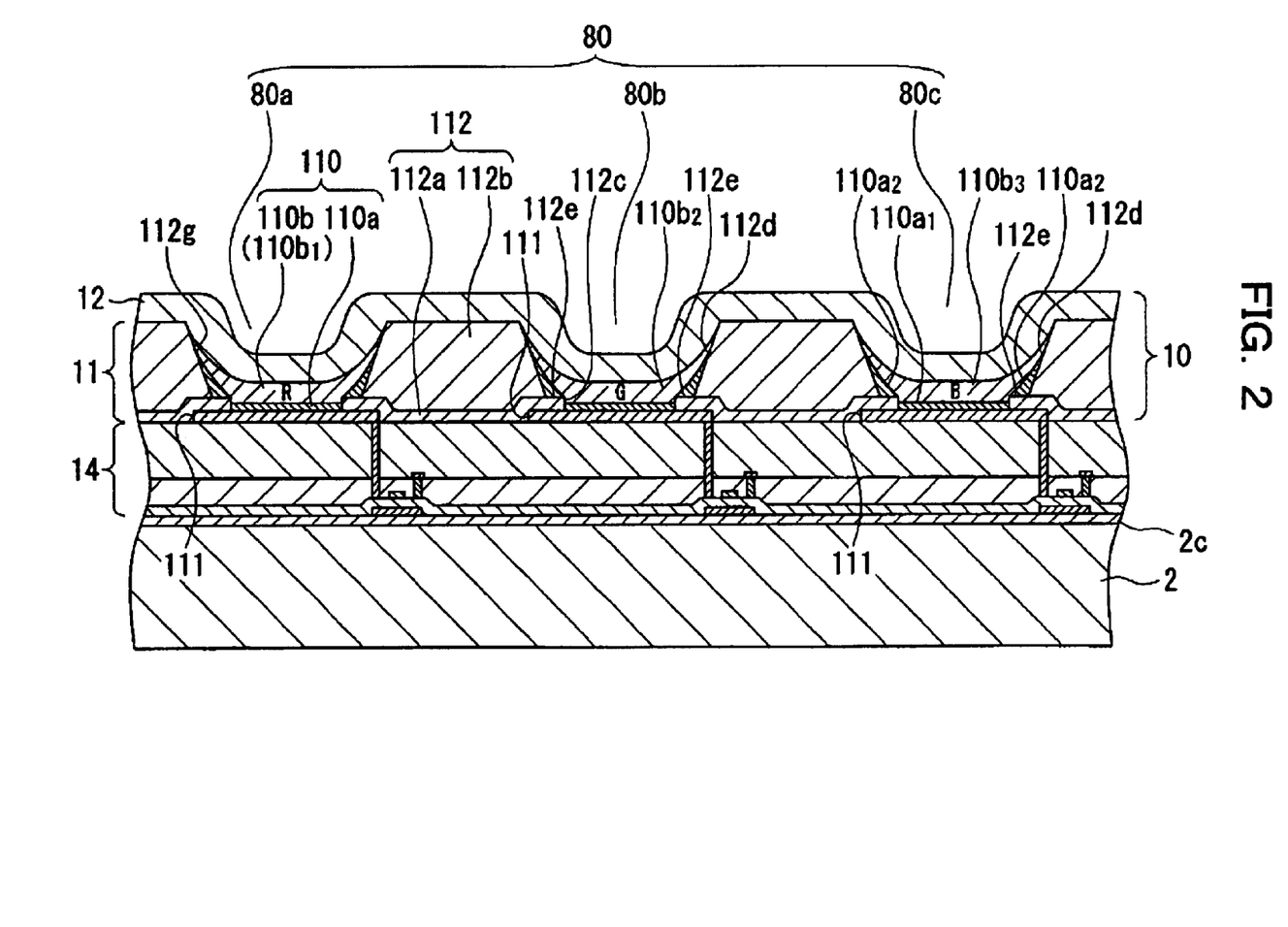
FIG. 2 is a sectional view showing the major parts of the organic EL device of the present invention.

Next, FIG. 2 shows an enlarged view of the partial cross-sectional structure of the effective viewing area.

As shown in FIG. 2, the effective viewing area is constructed by sequentially depositing a circuit element member 14, formed of a circuit including a TFT and so forth, and an emissive element member 11, formed of a functional layer 110. In this display 1, light emitted from the functional layer 110 toward the substrate 2 side passes through the circuit element member 14 and through the substrate 2, exiting the lower side (observer's side) of the substrate 2. At the same time, light emitted from the functional layer 110 toward the opposite side of the substrate 2 is reflected by the second electrode 12, whereupon it passes through the circuit element member 14 and through the substrate 2, exiting the lower side (observer's side) of the substrate 2.

Here, the aforementioned functional layer 110 comprises a hole injection/transport layer 110a, which is disposed in layers upon the first electrode 111, and a light-emitting layer 110b, which is formed upon and contiguous with the hole injection/transport layer 110a.

The aforementioned emissive element member 11 roughly comprises the functional layer 110, which is individually disposed in layers upon a plurality of first electrodes (pixel electrodes) 111, and a bank 112, which is provided between each of the first electrodes 111 and functional layers as a means of partitioning the functional layers 110. A second electrode 12 is disposed on the aforementioned functional layer 110. The emissive element comprises these first electrodes 111, the functional layer 110, and the second electrode 12.

Here, the first electrode 111, which is formed of indium tin oxide (ITO), for example, is formed by patterning it in an approximately rectangular shape as seen from the planar direction. The thickness of the first electrode 111 is preferably in the range of 50 to 200 nm, with about 150 nm being particularly desirable. A bank 112 is provided between these first electrodes 111. dots (regions) 80a, 80b and 80c are shown in FIG. 2. A plurality of dots, each dot separated by a bank 112, comprises a pixel 80. A plurality of pixels 80 is formed upon the substrate 2.

As shown in FIG. 2, the bank 112 comprises an inorganic barrier layer 112a (a first bank layer), which is located on the side nearer the substrate 2, and an organic barrier layer 112b (a second bank layer), which is deposited thereupon and apart from the substrate 2.

The inorganic barrier layer 112a and the organic barrier layer 112b are formed such that they ride up onto the edge of the first electrode 111. The perimeter of the first electrode 111 and the inorganic barrier layer 112a are arranged overlapping together on a plane.

Similarly, the organic barrier layer 112b is also arranged such that, in a planar view, it overlaps a portion of the first electrode 111. Moreover, the inorganic barrier layer 112a is formed further toward the center area of the first electrode 111 than is the organic barrier layer 112b. Thus, by forming the first deposited layer members 112e of the inorganic barrier layer 112a toward the inside of the first electrode 111, a lower opening 112c is provided in a location corresponding to that at which the first electrode 11 is formed.

An upper opening 112d is formed upon the organic barrier layer 112b. The upper opening 112d is formed corresponding to the location in which the first electrode 11 is formed and to the lower opening 112c. As shown in FIG. 2, the upper opening 112d is formed such that it is wider than the lower opening 112c but narrower than the first electrode 111. The upper opening 112d may also be formed such that the top portion of the upper opening 112d and the edge of the first electrode 111 are in approximately the same position. In such a case, the cross section of the upper opening 112d of the organic barrier layer 112b forms an incline, as shown in FIG. 2.

Furthermore, an opening 112g passing through the inorganic barrier layer 112a and the organic barrier layer 112b, is formed on the bank 112 by connecting a lower opening 112c and upper opening 112d continuously. As shown in FIG. 2, the functional layer 110 comprises the hole injection/transport layer 110a, which is disposed in a layer upon the first electrode 111, and the light-emitting layer 110b, which is formed upon and contiguous with the hole injection/transport layer 110a.

One method of forming the hole injection/transport layer 110a, for example, is to use an ink-jet apparatus to eject a composition for forming the hole injection/transport layer 110a upon a substrate 2 having the aforementioned structure. After ejection, the composition is heated and dried. Here, polythiophene derivatives such as polyethylenedioxythiophene and mixtures such as polystyrene sulfonate can be used as materials for forming the hole injection/transport layer.

The method of manufacturing the organic EL device of the present invention comprises ejecting and heat-treating the aforesaid ink composition for the organic EL device upon the substrate 2 having the first electrode, or upon the hole injection/transport layer 110a formed upon the substrate 2 having the first electrode.

As shown in FIG. 2, the light-emitting layer 110b is formed across the top of the flat area 110a1 of the hole injection/transport layer 110a, and across the top of the margin area 110a2. The thickness of the light-emitting layer 110b on the flat area 112a1 is in the range of 50 to 80 nm.

In addition, there are three kinds of light-emitting layers 110b: a red light-emitting layer 110b1 that emits red (R), a green light-emitting layer 110b2 that emits green (G), and a blue light-emitting layer 110b3 that emits blue (B). Light-emitting layers 110b1, 110b2, and 110b3 are arranged in a stripe formation.

The method for ejecting the ink composition for the organic EL device is not restricted to any particular method and, for example, the light-emitting layer 110b may be formed by ejecting the ink composition for the organic EL device using an ink-jet method (a droplet ejection method).

In addition, the ink composition for the organic EL device is ejected as described below onto a substrate, upon which a deposition process has been performed to form a circuit element member 14 comprised of a TFT or other circuit element, and on which the inorganic barrier layer 112a, the organic barrier layer 112b, and the hole injection/transport layer 110a have been formed.

In an ink-jet apparatus, moving an ink-jet head H5 and a substrate relative to one another, an ejection nozzle H6 formed in the ink-jet head H5 is arranged oppositely to the hole injection/transport layer 110a so as to eject the ink composition for forming the organic EL device. The ink composition, which contains each of the colors of organic light-emitting material, is ejected such that it lands on the hole injection/transport layer 110a, located inside the lower opening 112c and upper opening 112d.

Figure 3:
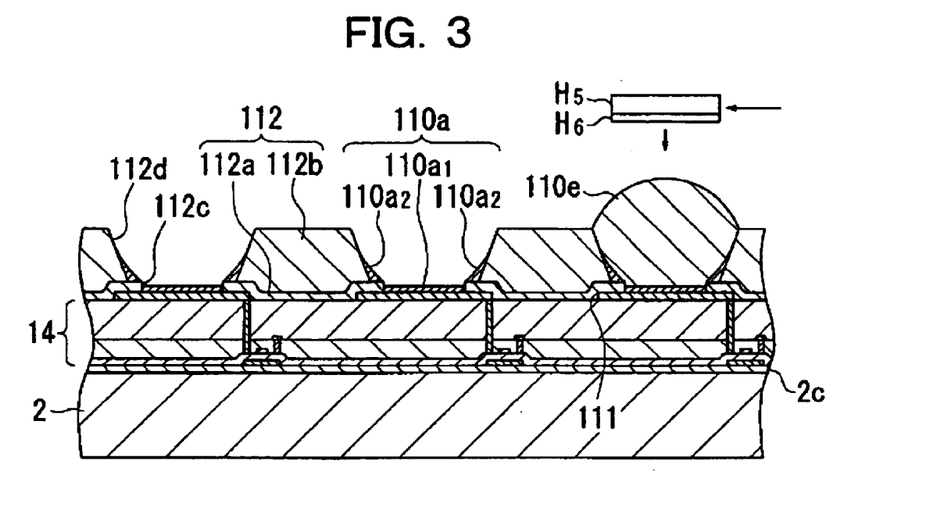
FIG. 3 is a sectional view illustrating the method of manufacturing the organic EL device of the present invention.

FIG. 3 shows the ink composition for the organic EL device after it is ejected by the ink-jet apparatus. In FIG. 3, the ink composition contains blue (B) organic light-emitting material.

In addition, the volume of liquid per droplet ejected from the ejection nozzle H6 is controlled.

A droplet (a droplet 110e of ink composition for the organic EL device) whose volume is thus controlled is ejected from the ejection nozzle H6. The droplet 110e of the ink composition for the organic EL device is ejected onto the hole injection/transport layer 110a.

The ejected droplet 110e of the ink composition for the organic EL device spreads out upon the hole injection/ transport layer 110a, filling the area within the lower opening 112c and the upper opening 112d.

The volume of ink composition for the organic EL device ejected upon each hole injection/transport layer 110a is determined in accordance with such factors as the size of the lower and upper opening, 112c and 112d respectively, the desired thickness of the light-emitting layer 110b, and the concentration of the material used to form the light-emitting layer within the ink composition for the organic EL device.

In addition, the ink composition for the organic EL device may be ejected atop the same hole injection/transport layer 110a only once or may be ejected thereupon separately multiple times. When ejected separately multiple times, the volume of the ejected droplet 110e of the ink composition for the organic EL device may be the same each time, or the volume of the droplet 110e of the ink composition for the organic EL device may be changed each time. Moreover, the ink composition for the organic EL device may not only be ejected onto the same location of a hole injection/transport layer 110a but may also be ejected onto different locations within the hole injection/transport layer 110a each time.

Next, after finishing with the ejection of the ink composition for the organic EL device in the predetermined locations, the organic thin film formed from the ejected droplet 110e of the ink composition for the organic EL device is heat-treated. The method of manufacturing the organic EL device of the present invention attains control of the film quality by heat-treating the organic thin film formed from the ejected droplet 110e of the ink composition for the organic EL device while the organic thin film still contains a high boiling point solvent.

The heating temperature is preferably at or below the boiling point of the high boiling point solvent. More preferably, the heating temperature is in the range of −15° C. to +40° C. from the glass transition temperature of the organic light-emitting material and, but, not more than the boiling point of the high boiling point solvent. Even more preferable is a heating temperature that is within a range up to 40° C. higher than the glass transition temperature of the organic light-emitting material and, moreover, is not more than the boiling point of the high boiling point solvent. A heating temperature that exceeds the boiling point of the high boiling point solvent is undesirable, because the high boiling point solvent contained in the organic thin film soon vaporizes, making it difficult to control film quality.

In addition, the heating time is preferably from 5 to 60 minutes, and more preferably is 20 to 40 minutes.

In addition, heat treatment can be performed using a hot plate or oven or other apparatus.

By thus heating the organic thin film formed from the droplet 110e of the ink composition for the organic EL device while the organic thin film still contains a high boiling point solvent, an organic thin film having a smooth surface is obtained.

Moreover, by pre-heat treating the organic thin film before a second electrode is formed, it is possible to approximate the film structure of an organic EL device in the driving state. Furthermore, distortion and other changes in film structure due to heat generated during organic EL device driving can be minimized by pre-heat treatment. Hence, these changes do not adversely affect element characteristics.

The light-emitting layer 110b is formed by drying the heat-treated organic thin film formed from the droplet 110e of the ink composition for the organic EL device. That is, drying causes the high boiling point solvent contained in the droplet 110e of the ink composition for the organic EL device to completely evaporate, and a blue (B) light-emitting layer 110b3 is formed as shown in FIG. 4.

The drying conditions for the ink composition for the organic EL device are as follows. For the blue (B) light-emitting layer 110b3, for example, drying is performed for 5 to 10 minutes under a pressure of about 133.3 Pa (1 Torr), at room temperature within a nitrogen atmosphere. A pressure that is too low is undesirable because the ink composition for the organic EL device will be bumped. A temperature that is equal to or above room temperature is undesirable because it accelerates the evaporation of a high boiling point solvent, causing the material used to form the light-emitting layer to heavily adhere to the wall surface of the upper opening 112d.

Figure 4:
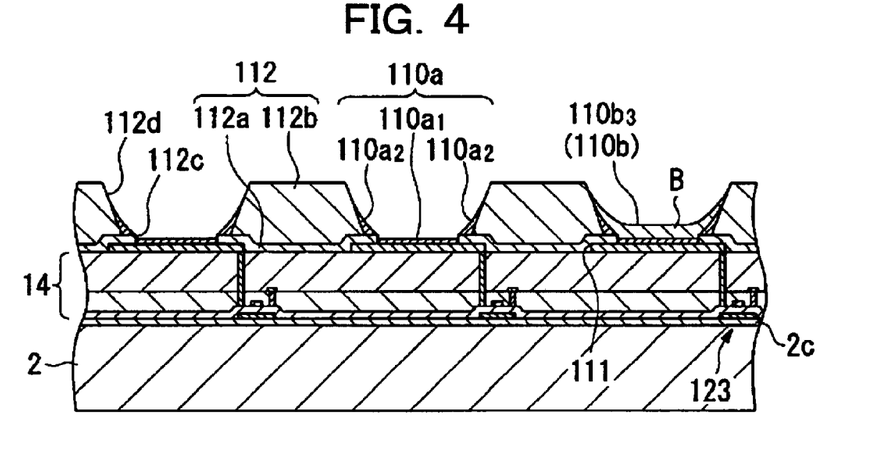
FIG. 4 is a sectional view illustrating the method of manufacturing the organic EL device of the present invention.

Furthermore, although only one blue (B) light-emitting layer 110b3 is depicted in FIG. 4, an organic EL device is inherently formed in a matrix and, hence, numerous blue (B) light-emitting layers 110b3 are actually formed.

Figure 5:
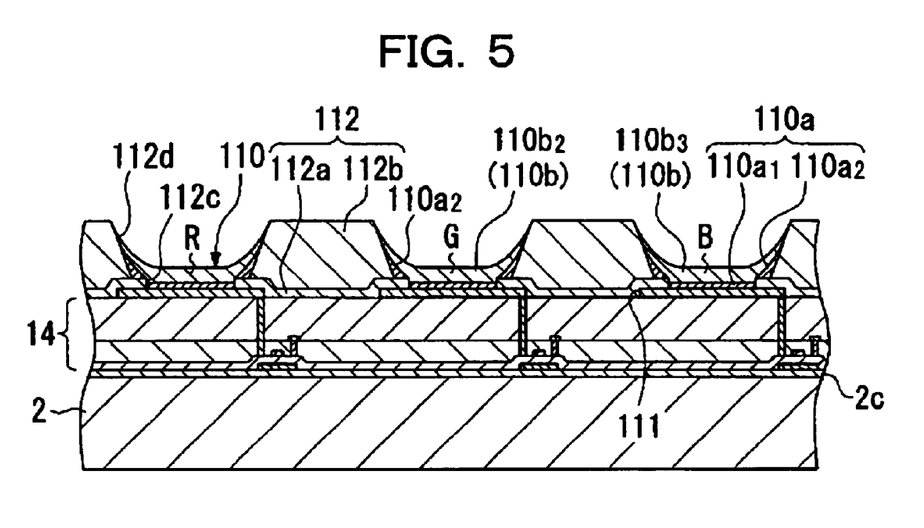
FIG. 5 is a sectional view illustrating the method of manufacturing the organic EL device of the present invention.

Then, as shown in FIG. 5, using a process similar to that used for the blue (B) light-emitting layer 110b3, the red (R) light-emitting layer 110b1 is formed, followed finally by the formation of the green (G) light-emitting layer 110b2.

Quick-drying is preferable when forming the red light-emitting layer b1 and the green light-emitting layer 110b2, because the materials used to form these light-emitting layers contain a large number of components. Thus, it is desirable, for example, to perform drying by blowing nitrogen for 5 to 10 minutes at 40° C. Other means of drying that can be cited as examples are far-infrared irradiation drying and high-temperature nitrogen gas blowing.

In addition, the light-emitting layer 110b formation sequence is not limited to the aforementioned sequence. The light-emitting layers 110b may be formed in any order. For example, it is also possible to decide the order with which to form the light-emitting layers in accordance with the material used to form the light-emitting layer. Furthermore, additional other functional layers having other functions may also be formed contiguous with the light-emitting layer 110b. For example, it is also possible to form an electron transport layer.

Figure 6:
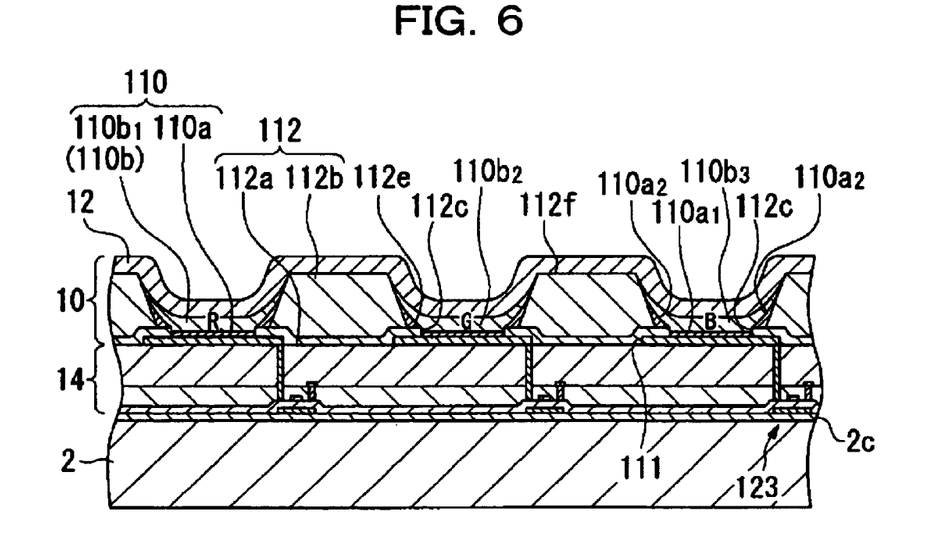
FIG. 6 is a sectional view illustrating the method of manufacturing the organic EL device of the present invention.

In a manufacturing process of an organic EL device, a second electrode 12 (opposing electrode) is formed, as shown in FIG. 6, over the entire surface of the light-emitting layer 110b and the bank 112 formed as described above, by using a sputtering method or an other well-known method. The second electrode 12 may also be formed by layering a plurality of materials.

As explained above, the method of manufacturing the organic EL device of the present invention, improves the smoothness of the organic thin film comprising the light-emitting layer 110b and the mutual adhesion of organic thin films disposed in layers, thereby enabling the manufacture of an organic EL device that has a long lifetime and superior emissive properties such as emission luminance stability.

EXAMPLES

First Example

An aqueous solution of a mixture of PEDT (polyethylene dioxythiophene) and PSS (polystyrene sulfonate) was ejected by an ink-jet apparatus onto a substrate upon which had already been formed an ITO transparent electrode (the first electrode) and a bank for patterning pixels using an ink-jet method. The aqueous solution was then heat-dried, thus removing solvent and forming a hole injection/transport layer.

Next, the ink composition for the organic EL device, including a concentration of 0.8 weight percent of an isopropyl biphenyl having a boiling point of 290° C. and a poly-dioctyl fluorene as an organic light-emitting material having a glass transition temperature of 80° C., was ejected onto the hole injection/transport layer. The viscosity of the ink composition for the organic EL device at this time was 5 mPa.s.

After the ink composition for the organic EL device was ejected, it was heat-treated for 30 minutes at 65° C. within a nitrogen atmosphere under atmospheric pressure. It was then dried to form a light-emitting layer.

An organic EL device was then produced by forming a second electrode upon this light-emitting layer by vacuum-deposition. The lifetime of the organic EL device thus formed was measured.

Second Example

An organic EL device was produced by the same method as that described in the first example except that after the ink composition for the organic EL device was ejected, it was heated at 120° C. within a nitrogen atmosphere under atmospheric pressure. The lifetime of the organic EL device was then measured.

Comparative Example

An organic EL device was produced by the same method as that described in the first example except that no heat-treatment was performed after the ink composition for the organic EL device was ejected. The lifetime of the organic EL device was then measured.

Method of Measuring Organic EL Device Lifetime

To measure the lifetime of an organic EL device, a constant current was applied to the organic EL device and the device was continuously driven at room temperature and at an initial luminance of 100 cd/m$^2$. The time it took until the emitted luminance declined to 50% of the initial luminance was measured. Assigning a value of 1 to the lifetime of the organic EL device produced in the comparative example, which was produced without heat-treatment, the lifetime of the organic EL device of each example was calculated as a relative value.

The lifetime of the organic EL devices produced as described in the first example, in the second example, and in the comparative example was found using the aforementioned method. Where the lifetime of the organic EL device produced as described in the comparative example is 1, the lifetime of the organic EL device produced as described in the first example was 1.5, and the lifetime of the organic EL device produced as described in the second example was 2.1.

As stated above, the lifetime of an organic EL device having a light-emitting layer that was heat-treated within the range of −15 to +40° C. from the glass transition temperature of the organic light-emitting material and, moreover, at or below the boiling point of a high boiling point solvent was longer than the lifetime of the organic EL device having a light-emitting layer that was not heat-treated. Particularly, the organic EL device having a light-emitting layer that was heat-treated at a temperature not more than the boiling point of the high boiling point solvent and, moreover, within a range up to +40° C. from the glass transition temperature of the organic light-emitting material had a longer lifetime.

An ink composition for the organic EL device according to the present invention can be used to obtain an organic thin film having excellent smoothness and excellent mutual adhesion of organic thin film to one another.

Moreover, the organic EL device manufacturing method of the present invention improves the smoothness of the organic thin film that comprises the light-emitting layer, improves the mutual adhesion of organic thin films where said organic thin films are disposed in layers, enables the manufacture of an organic EL device that has a long lifetime and superior emissive properties such as stability of emission luminance, and is extremely beneficial to industry.

What is claimed is:

1. A method of manufacturing an organic EL device including a light-emitting layer formed between a first electrode and a second electrode, comprising:

forming the light-emitting layer by ejecting an ink composition for the organic EL device that includes an organic light-emitting material and at least one high boiling point solvent having a boiling Doint of 200° C. or higher on the first electrode, and subsequently heat-treating the ink composition; and thereafter, forming the second electrode over the surface of the light-emitting layer.

2. The method of manufacturing the organic EL device according to claim 1, wherein the ink composition for the organic EL device is ejected by an ink-jet apparatus.

3. The method of manufacturing the organic EL device according to claim 1, wherein a plurality of pixels including a plurality of dots is formed on a substrate having the first electrode, the dots being separated by a bank.

4. The method of manufacturing the organic EL device according to claim 1, wherein the ejected ink composition is heat-treated while a residue of the high boiling point solvent remains within the ink composition.

5. The method of manufacturing the organic EL device according to claim 4, wherein heat treatment is performed at a temperature that is not more than the boiling point of the high boiling point solvent.

6. The method of manufacturing the organic EL device according to claim 4, wherein the ejected ink composition for the organic EL device is heat-treated within an inert gas environment at −15 to +40° C. from the glass transition temperature of the organic light-emitting material and at a temperature that is not more than the boiling point of the high boiling point solvent.

* * * * *